United States Patent
Watanabe et al.

(10) Patent No.: US 6,898,267 B2
(45) Date of Patent: May 24, 2005

(54) X-RAY MASK

(75) Inventors: Hiroshi Watanabe, Hyogo (JP); Kouji Kise, Hyogo (JP); Hideki Yabe, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 50 days.

(21) Appl. No.: 10/282,208

(22) Filed: Oct. 29, 2002

(65) Prior Publication Data

US 2003/0219095 A1 Nov. 27, 2003

(30) Foreign Application Priority Data

May 21, 2002 (JP) ........................ 2002-146369

(51) Int. Cl.$^7$ .................................................. G21K 5/00
(52) U.S. Cl. ........................................................ 378/35
(58) Field of Search ...................................... 378/34, 35

(56) References Cited

U.S. PATENT DOCUMENTS

| | | | | |
|---|---|---|---|---|
| 4,604,292 A | * | 8/1986 | Evans et al. | 427/569 |
| 4,698,285 A | * | 10/1987 | Ehrfeld et al. | 430/5 |
| 5,870,448 A | * | 2/1999 | Maehara et al. | 378/35 |
| 6,434,053 B1 | | 8/2002 | Fujuwara | |

OTHER PUBLICATIONS

Fujii, K., et al., "Low–dose exposure technique for 100–nm–diam hole replication in x–ray lithography", J. Vac. Sci. Technol. B 16 (6), Nov./Dec. 1998, pp. 3504–3508.

Fujii, K., et al., "Optimum Phase Condition for Low–Contrast X–Ray Masks", Jpn. J. Appl. Phys. vol. 38, 1999, pp. 7076–7079.

Toyota, E., et al., "Technique for 25nm x–ray Nanolithography", J. Vac. Sci. Techonol. B 19 (6), Nov./Dec. 2001, pp. 2428–2433.

* cited by examiner

Primary Examiner—CRaig E. Church
(74) Attorney, Agent, or Firm—Leydig, Voit & Mayer, Ltd.

(57) ABSTRACT

In an x-ray absorber in accordance with the present invention, reduced transmittance of the x-ray absorber is suppressed while phase shift amount in the vicinity of $\pi$-radians is achieved. For this purpose, a material is used that has a high transmittance per film thickness and contains an element with a high phase shift amount and an element with a low transmittance, as a material composition that forms the x-ray absorber. In other words, the transmittance of the x-ray absorber is mainly determined by the element with a low transmittance, and phase shift falling short of $\pi$-radians is compensated with the element with a high transmittance and a high phase shift.

7 Claims, 5 Drawing Sheets

X-RAY MASK

BACKGROUND OF THE INVENTION

1. Field of the Invention

The present invention relates to an x-ray mask for a fine pattern-forming technique, an x-ray exposure device, an x-ray exposure method, and a semiconductor device manufactured though the x-ray exposure method. More particularly, the present invention relates to a technique allowing for a fast and fine pattern transfer as compared with the conventional technique, for use in a system of transferring a fine pattern formed on an x-ray mask by an x-ray proximity exposure technique, in a technique of transferring a fine pattern mainly for manufacturing a semiconductor integrated circuit.

2. Description of the Background Art

Figure 9:
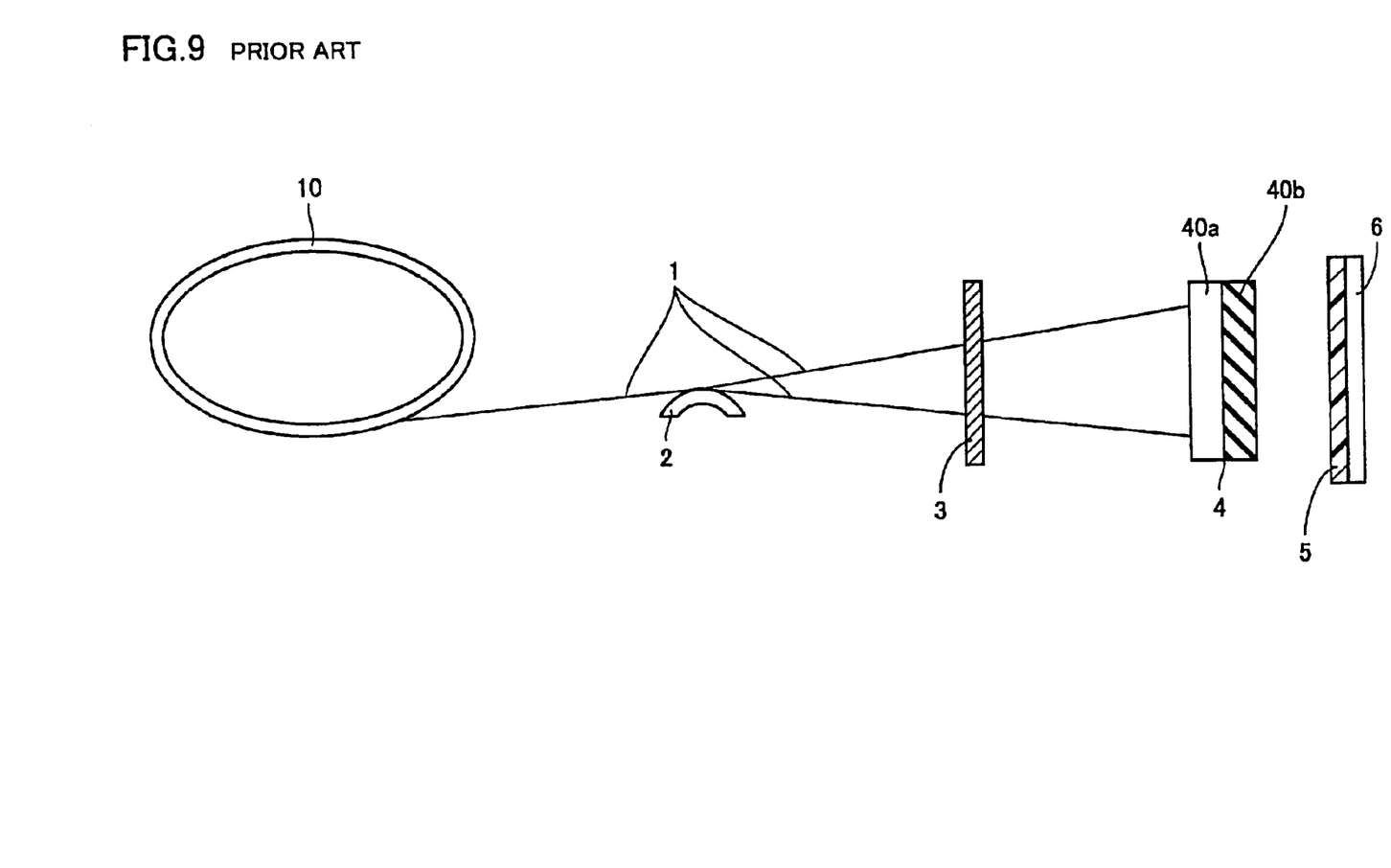
FIG. 9 is a diagram schematically showing a conventional x-ray proximity exposure method.

A conventional x-ray proximity exposure method is schematically shown in FIG. 9. X-rays 1 emitted from an electron storage ring 10 are condensed by a mirror 2 into a prescribed range. X-rays 1 transmitted through a vacuum protective filter 3 radiate onto a wafer 6 with a resist 5 arranged in the proximity of an x-ray mask 4 at a prescribed distance. X-ray mask 4 is formed of an x-ray transmission body 40a and an x-ray absorber 40b with a pattern formed thereon, and x-rays 1 transmitted through x-ray transmission body 40a and x-ray absorber 40b radiate onto resist 5 on wafer 6. Resist 5 that absorbs x-rays 1 produces secondary electrons, which cause a chemical reaction of resist 5. The x-ray mask pattern is thus transferred to resist 5.

Resolution of x-ray proximity exposure is said to be determined by two factors: (i) resolution limit of an aerial image determined by Fresnel diffraction and (ii) resolution limit determined by so-called secondary electron scattering, that is, photoelectrons and Auger electrons produced in the resist by radiation of exposure light scatter into an infinite region.

The secondary electron scattering in (ii) increases with higher electron energy and reduces with lower electron energy. Photoelectrons of secondary electrons have higher energy and lower the resolution as the absorption wavelength of x-rays becomes shorter. On the other hand, in (i), the image of x-ray absorption energy formed in a resist is dependent on Fresnel diffraction of x-rays transmitted through the x-ray mask, and resolution limit R can be expressed by the following equation (1):

$$R = k(\lambda \cdot G)^{1/2} \tag{1}$$

where k is a constant depending on the mask absorber material, the mask pattern geometry and the exposure system. $\lambda$ represents the wavelength of x-rays absorbed in the resist, and G represents the distance between the mask and the wafer (exposure gap). From the above equation (1), it can be understood that the shorter the x-ray wavelength is or the narrower the distance between the mask and the wafer is, the higher the resolution becomes, and the longer the x-ray wavelength is or the wider the distance between the mask and the wafer is, the lower the resolution becomes. However, since the resolution is worsened due to photoelectrons scattering in the resist with shorter wavelength, in practice, a wavelength having such a range is used in that the photoelectrons scattering is not increased as compared with a pattern size.

The following three methods have been proposed as a method of transferring a pattern with a small k. A first method is described in J. Vac. Sci. Technol., B16(1998), p. 3504 in which an isolated opening pattern is formed by optimizing a mask pattern geometry. A second method is described in Jpn. J. Appl. Phys., Vol. 38(1999), p. 7076 in which a periodic line-and-space pattern is formed by optimizing a contrast and a phase shift amount of an x-ray absorber. A third method is described in J. Vac. Sci. Technol., B19 (2001), p. 2428 in which a pattern is formed by performing multiple exposures. Any of the methods allows for formation of a finer pattern without changing exposure gap or wavelength.

Figure 10:
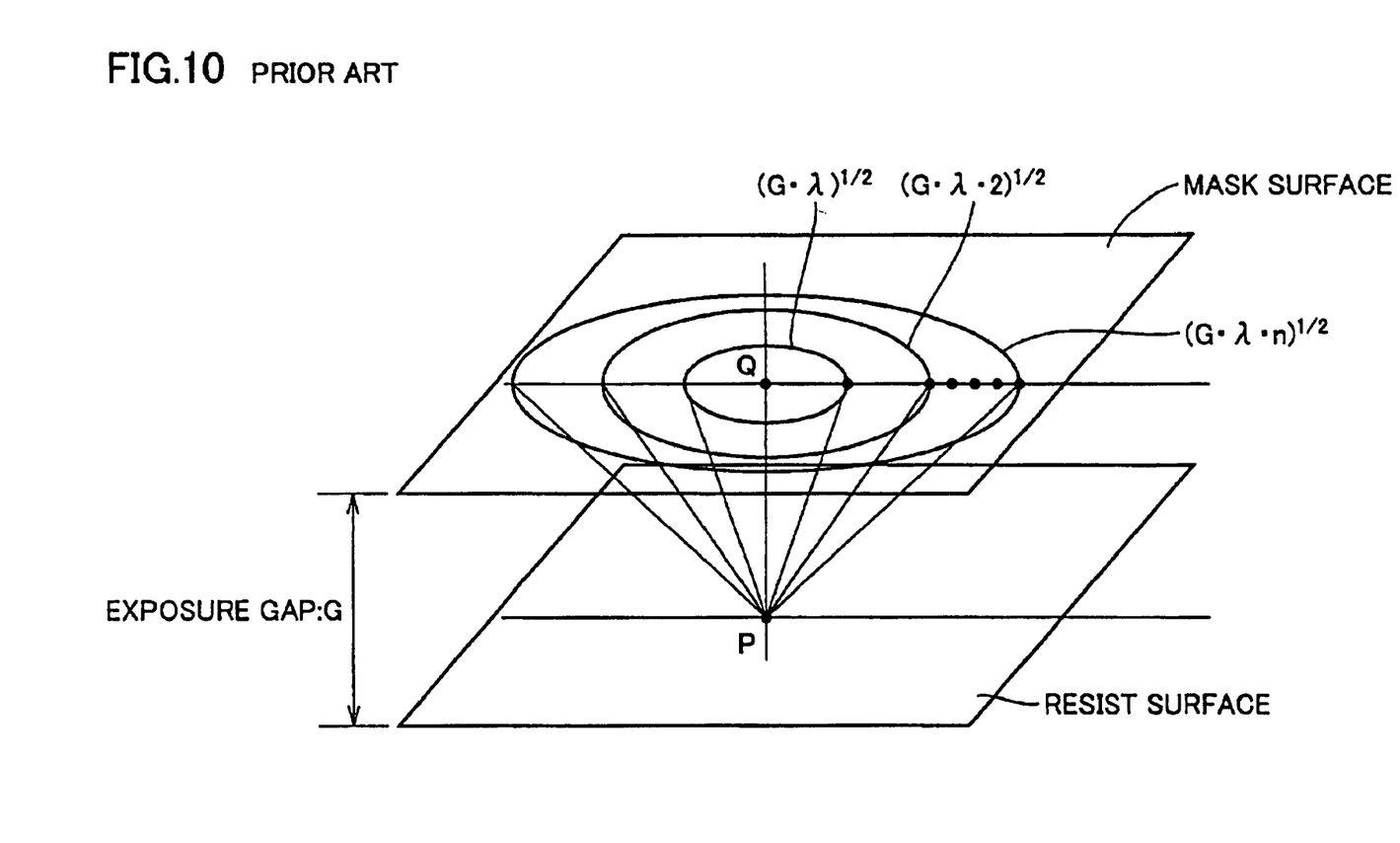
FIG. 10 is a schematic diagram illustrating a Fresnel's annular zone.

First, the problem of the above first exposure method described in J. Vac. Sci. Technol., B16 (1998), p.3504 to obtain an isolated opening pattern will be described. FIG. 10 is a schematic diagram illustrating a Fresnel annular zone. The light intensity at a position P on the resist surface is determined by contribution of all light transmitted through the mask and reaching position P. When the mask surface is divided into regions expressed by so-called Fresnel annular zones, Fresnel diffraction is characterized in that contributions to the intensity of light transmittance through the mask surface onto position P on the resist surface are cancelled between the adjacent Fresnel annular zones because there is a difference of $\pi$ radians in the phase of x-rays reaching position P.

Here the n-th Fresnel annular zone refers to an annular region between radius $(G \cdot \lambda \cdot (n-1))^{1/2}$ and $(G \cdot \lambda \cdot n)^{1/2}$ with respect to a mask position Q as the center vertically above position P. In order to realize an ideal state in which the intensity is maximized at position P, the phase in an even-numbered Fresnel annular zone may be shifted by $\pi$ radians for attaining the same phase at position P.

In the exposure method described in J. Vac. Sci. Technol., B16(1998), p.3504 to form a fine isolated pattern, light contributing to the same phase is taken in as much as possible by making the size of an opening equal to the size of the first Fresnel's annular zone and by shielding the other region with an x-ray absorber, and light rays opposite in phase that cancel each other are reduced by the x-ray absorber. Accordingly, the intensity on the resist at the center of the opening is increased so that the resolution is improved.

Since the annular region is varied with the exposure gap and the wavelength, appropriate exposure gap and wavelength have to be selected in accordance with a pattern. In this method, the phase difference by the light transmitted through the x-ray absorber positioned in a second Fresnel annular zone is not $\pi$ radians that is the opposite phase, but $(1/2) \cdot \pi$ radians in total, since the phase shift amount of the x-ray absorber is produced by $(-1/2) \cdot \pi$ radians. Therefore the cancellation effect of the second Fresnel annular zone is relieved and the intensity as position P is effectively increased.

Unfortunately, however, the phase in the second Fresnel annular zone is smaller by $(1/2) \cdot \pi$ radian as compared with $\pi$ radians as an ideal state of the phase shift amount and the intensity increasing effect at position P is suppressed. Furthermore, provided that the thickness of the x-ray absorber is increased in order to bring the phase shift amount of the x-ray absorber close to $\pi$ radians, the processing becomes difficult. In addition, since the transmittance of the x-ray absorber is reduced, the contribution to the intensity at position P is undesirably reduced.

Next, the problem of the above second exposure method described in Jpn. J. Appl. Phys., Vol. 38(1999), p.7076 to form a fine line-and-space pattern will be described.

In this method, the phase shift amount of the x-ray absorber is $(-1/2) \cdot \pi$ radian, and an optical path difference of light transmitted through the x-ray absorber and light transmitted through the x-ray transmission body is $(1/2)\cdot\pi$ radian, so that both light rays are of the same phase on the resist immediately below the x-ray transmission body and of opposite phase on the resist immediately below the x-ray absorber. Since the light transmitted through the x-ray absorber is used for pattern formation, this effect is not achieved if the mask contrast of the x-ray absorber (a value of the quantity of light transmitted through the x-ray transmission body divided by the quantity of light transmitted through the x-ray absorber) is high.

On the contrary, if the mask contrast of the x-ray absorber is too low, optical interference takes place and an unnecessary pattern is formed on the resist immediately below the x-ray absorber. Therefore a mask contrast of approximately three is used. Though this attains an aerial image having a relatively high contrast, the period of the transfer pattern cannot be made smaller than the period of the mask pattern.

Next, the problem of the third exposure method described in J. Vac. Sci. Technol., B19(2001), p.2428 to obtain a periodic pattern will be described. In this exposure method, by utilizing the fact that resolution of the resist pattern is high where the pattern has a long repeated period, close to an isolated pattern, a resist pattern having a period less than half the mask pattern period is formed by multiple exposures with displaced exposure positions. In case of the this method, however, the increased number of exposures reduces throughput.

SUMMARY OF THE INVENTION

An object of the present invention is to provide an x-ray mask and a semiconductor device manufactured through this x-ray exposure method.

In accordance with one aspect of the present invention, an x-ray mask formed of an x-ray transmission body and an x-ray absorber is provided, for use in an x-ray exposure method of irradiating a resist with x-rays emitted from an x-ray source. When the x-ray absorber is irradiated with x-rays having an average absorption wavelength in the resist, a phase shift amount of the x-rays is in the range of $(-1/2)\cdot\pi$ radian to $(-3/2)\cdot\pi$ radian. When the x-ray absorber is irradiated with x-rays having an average absorption wavelength in the resist, a mask contrast of the x-ray absorber is in the range of 2 to 5.

According to this x-ray mask, it is possible to form a pattern finer than the mask pattern, using an isolated opening mask pattern. Furthermore, since the intensity at the center of the isolated opening is increased and the exposure time can be shortened in an exposure step, throughput can be improved.

Any material of diamond, silicon, silicon carbide, and silicon nitride is used as the x-ray transmission body. The x-ray absorber has a two-layer structure formed of a first x-ray absorber provided on the x-ray transmission body and a second x-ray absorber provided on the first x-ray absorber. When the first x-ray absorber is irradiated with x-rays having an average absorption wavelength in the resist, the first x-ray absorber has a transmittance of at least 80% and a phase shift amount in the range of $(-1/2)\cdot\pi$ radian to $(-3/2)\cdot\pi$ radian. The second x-ray absorber has a transmittance of at least 30% and at most 60% and a phase shift amount in the range of $(-1/2)\cdot\pi$ radian to $(-3/2)\cdot\pi$ radian. The x-ray absorber with the first x-ray absorber and the second x-ray absorber overlapped has a transmittance in the range of 20% to 50% and a phase shift amount in the range of $(-1/2)\cdot\pi$ radian to $(-3/2)\cdot\pi$ radian.

In this manner, the x-ray absorber is formed of the first x-ray absorber having a high transmittance and the separate, second x-ray absorber having a low transmittance, so that a combination of transmittance and phase shift amount which cannot be attained with a single element, particularly an x-ray mask with a phase shift amount of $-\pi$ and a mask contrast of 3, can be formed with a small thickness, and the optimal process conditions can be selected for each layer. Therefore the mask pattern can be processed easily.

In the x-ray mask above, preferably, an opening portion of the first x-ray absorber that exposes the x-ray transmission body is provided to be included in an opening portion of the second x-ray absorber. An opening width of the opening portion of the first x-ray absorber is provided to be smaller than an opening width of the opening portion of the second x-ray absorber.

Since the optical path difference from the vicinity of the opening portion interface is canceled by a phase shift of the first x-ray absorber having a high transmittance, of the x-ray absorber, reduced intensity at the central portion of the opening can be suppressed and a finer opening pattern can be formed.

In accordance with another aspect of the present invention, an x-ray mask formed of a stencil mask made of only an x-ray absorber for use in an x-ray exposure method of irradiating a resist with x-rays emitted from an x-ray source is provided. The x-ray absorber has a two-layer structure formed of a first x-ray absorber and a second x-ray absorber. When the first x-ray absorber is irradiated with x-rays having an average absorption wavelength in the resist, the first x-ray absorber has a transmittance of at least 80% and a phase shift amount in the range of $(-1/2)\cdot\pi$ radian to $(-3/2)\cdot\pi$ radian. The second x-ray absorber has a transmittance of at least 30% and at most 60% and a phase shift amount in the range of $(-1/2)\cdot\pi$ radian to $(-3/2)\cdot\pi$ radian. The x-ray absorber with the first x-ray absorber and the second x-ray absorber overlapped has a transmittance in the range of 20% to 50% and a phase shift amount in the range of $(-1/2)\cdot\pi$ radian to $(-3/2)\cdot\pi$ radian.

In this manner, since the stencil mask is not provided with an x-ray transmission body, x-rays are not attenuated by the x-ray transmission body, and even higher intensity of light can be assured, Therefore throughput can be improved in the exposure step.

In accordance with a further aspect of the present invention, an x-ray mask formed of an x-ray transmission body and an x-ray absorber for use in an x-ray exposure method of irradiating a resist with x-rays emitted from an x-ray source is provided. When the x-ray absorber is irradiated with x-rays having an average absorption wavelength in the resist, a phase shift amount of the x-ray absorber is approximately $-\pi$ radian and a transmittance of the x-ray mask is at least 70%.

When a periodic line-and-space mask pattern is formed and transferred, a resist pattern having a period half the period of the mask pattern can be transferred in a single exposure. Therefore a high density pattern can be easily realized.

In accordance with yet another aspect of the present invention, a periodic opening pattern is provided in the x-ray absorber, and an adjusting film having a transmittance approximately equal to a transmittance of the x-ray absorber is provided on the x-ray transmission body in an opening of the x-ray absorber.

In this manner, the adjusting film having a transmittance approximately equal to the transmittance of the x-ray absorber is provided on the x-ray transmission body in the openings of the x-ray absorber, so that the pattern sections of the x-ray absorber and the x-ray transmission body can have the approximately same x-ray transmittance.

Furthermore, in accordance with the present invention, an x-ray exposure device irradiates the resist with x-rays emitted from the x-ray source and passing through the x-ray mask described above.

In accordance with one aspect of the present invention, an x-ray exposure method of irradiating a resist with x-rays having passed through the x-ray mask described above is provided. The method includes the step of forming on the resist an opening pattern finer than the opening mask pattern size of the x-ray mask. According to this exposure method, since the intensity at the center of the opening is increased, a pattern finer than the mask pattern size can be formed.

In accordance with another aspect of the present invention, an x-ray exposure method of irradiating a resist with x-rays having passing through an x-ray mask formed of an x-ray transmission body and an x-ray absorber, is provided. When the x-ray absorber is irradiated with x-rays having an average absorption wavelength in the resist, a phase shift amount of the x-ray absorber is approximately $-\pi$ radian and a transmittance of the x-ray mask is at least 70%. The x-ray mask has a periodic pattern in which a pattern of the x-ray absorber and a pattern of the x-ray transmission body that is exposed from an opening portion of the x-ray absorber pattern are alternately arranged. The method includes the step of forming on the resist a periodic pattern having a period size half a period size of the periodic pattern of the mask. According to this exposure method, since a pattern having a period half that of the mask pattern can be transferred, a higher-density pattern can be obtained.

In accordance with the present invention, a semiconductor device is provided which is manufactured through the step including the step of processing a resist pattern formed using the exposure method as described above. As a result, a finer, higher-density semiconductor device can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described in detail. It is noted that the present invention is characterized by an x-ray mask for use in a conventional x-ray proximity exposure method. The x-ray proximity exposure method is performed using optics having a structure similar to that shown in FIG. 9.

An object of the present invention is to solve the following problem. Although a phase shift amount in the second Fresnel's annular zone in an x-ray absorber is desirably $-\pi$ radian in order to increase the intensity at the center of an isolated fine pattern, increased phase shift amount reduces the transmittance of the x-ray absorber. Therefore the center intensity cannot be enhanced.

In the x-ray absorber in accordance with the present invention, reduced transmittance of the x-ray absorber is suppressed while the phase shift amount is provided in the vicinity of $-\pi$ radian. For this purpose, it is characterized in that such a material is used that has a high transmittance per film thickness and contains an element with a high phase shift amount and an element with a low transmittance, as a material composition that forms the x-ray absorber. In other words, the transmittance of the x-ray absorber is mainly determined by the element with a low transmittance, and the phase shift amount falling short of $-\pi$ radian is compensated with the element with a high transmittance and a high phase shift amount. As a result, an x-ray mask pattern is provided that suppresses the reduced transmittance of the x-ray absorber and realizes the phase shift amount in the vicinity of $-\pi$ radian.

Although the phase shift amount of the x-ray absorber for the average absorption wavelength in the resist is most preferably $-\pi$ radian, a high resolution can be obtained as compared with a conventional technique as long as it is in the range of $(-1/2)\cdot\pi$ radian to $(-3/2)\cdot\pi$ radian. When the mask contrast of the x-ray absorber for the average absorption wavelength in the resist is low, the resist absorption intensity at the center of the isolated fine pattern may be increased. If this mask contrast is too low, an unnecessary pattern is formed due to photosensitization of the resist below the x-ray absorber and light interference effect. Therefore it is preferable that the mask contrast is from 2 to 5 and the transmittance is from 20% to 50%.

From the viewpoint as described above, a fine, isolated transfer pattern can be formed by using the x-ray mask in accordance with the embodiment of the present invention described below. Furthermore, as the center intensity is increased, an exposure amount necessary to form a pattern can be reduced and throughput can thus be increased. In addition, in the x-ray mask in accordance with the present embodiment, the phase shift amount of the absorber pattern is in the vicinity of $-\pi$ radian, so that a transfer pattern having a period half the period of the mask pattern can be provided. This x-ray mask is characterized by the use of an x-ray mask absorber material having a transmittance higher than that of the conventional technique and a phase shift amount of $-\pi$ radian.

(Operation of the Exposure Method)

Figure 1:
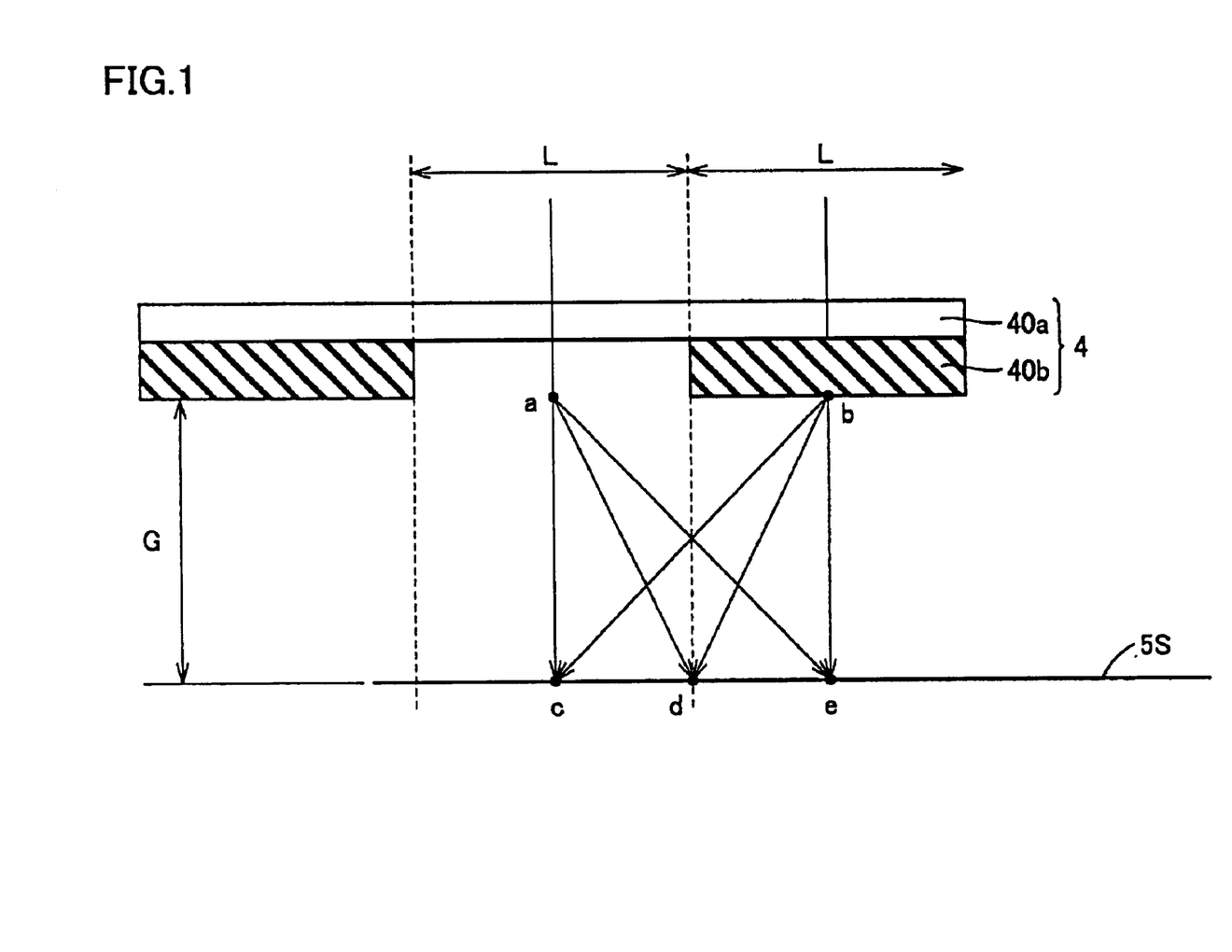
FIG. 1 is a diagram illustrating a phase difference between light a transmitted through the center of an x-ray transmission body and light b transmitted through the center of an x-ray absorber in a 2×L period line-and-space mask pattern, at a position c immediately below x-ray transmission body, a position d immediately below a border between x-ray transmission body and x-ray absorber and a position e immediately below x-ray absorber, each on a resist surface at a distance of an exposure gap.

In the following, the operation of the exposure method in accordance with the present invention will be described using a periodic line-and-space pattern by way of example. FIG. 1 is a diagram illustrating a phase difference between light a transmitted through the center of an x-ray transmission body 40a and light b transmitted through the center of an x-ray absorber 40b in a 2×L period line-and-space mask pattern, at a position c immediately below x-ray transmission body 40a, a position d immediately below a border between x-ray transmission body 40a and x-ray absorber 40b and a position e immediately below x-ray absorber 40b, each on a resist surface 5S at a distance of an exposure gap G. Here exposure gap G is set as $G=L^2/\lambda$.

In the beginning, consider a phase difference between light passing through a-c and light passing through b-c at position c on resist surface 5S. The light passing through b-c has a phase lag by $-\pi$ in x-ray absorber 40b, with respect to the light passing through a-c. Since the exposure gap is set as $G=L^2/\lambda$, the optical path difference of a-c and b-c is $\pi$. As a result, the phase difference between the light passing through a-c and the light passing through b-c is $-\pi+\pi=0$. In other words, the light passing through a-c and the light passing through b-c are of the same phase and are strengthened with each other.

Consider a phase difference between light passing through a-e and light passing through b-e at position e. The light passing through a-e has a phase lead by $-\pi$ in x-ray absorber 40b. On the other hand, the light transmitted through b-e has a phase lag by $-\pi$ due to the optical path difference. As a result, the phase difference between the light passing through a-e and the light passing through b-e is $-\pi-\pi=-2\pi$, and these light rays are of the same phase and are strengthened with each other at position e.

Now consider a phase difference between light passing through a-d and light passing through b-d at position d. In this case, the optical path difference of the light passing through a-d and the light passing through b-d is equal. However, since only the light passing through b-d has a phase changed by $-\pi$ through x-ray absorber 40b, as a result, the phase difference between the light passing through a-d and the light passing through b-d is $-\pi-0=-\pi$ and the light rays are of opposite phase and weakened with each other at position d.

Therefore in the line-and-space pattern of period 2×L, the light is strengthened at a position on resist surface 5S immediately below the pattern segments of x-ray absorber 40b and x-ray transmission body 40a, and is weakened at a position on resist surface 5S immediately below the border between the pattern segments of x-ray absorber 40b and x-ray transmission body 40a.

Unlike the conventional transfer method, since aerial image can be formed not only immediately below the pattern segment of x-ray transmission body 40a but also immediately below the pattern segment of x-ray absorber 4b, a periodic pattern with a period half the mask pattern period (L) can be formed. In addition, since the light is opposite in phase and weakened with each other at the border between the pattern segments of x-ray absorber 40b and x-ray transmission body 40a, a pattern with a high contrast can be formed in particular.

(First Embodiment)

(X-ray Mask 4A)

Figure 2:
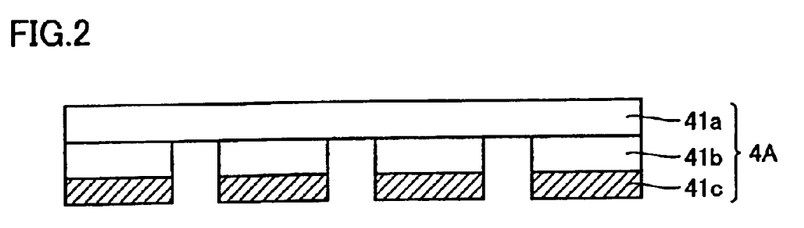
FIG. 2 illustrates a cross-sectional structure of an x-ray mask in accordance with a first embodiment of the present invention.

In the following, an x-ray mask 4A in a first embodiment of the present invention will be described with reference to FIG. 2. FIG. 2 illustrates a cross-sectional structure of x-ray mask 4A. X-ray mask 4A uses diamond 41a having a thickness of 2 $\mu$m as an x-ray transmission body material and has a two-layer structure formed of diamond 41b serving as a first x-ray absorber provided on diamond 41a and tungsten 41c serving as a second x-ray absorber provided on this diamond 41b, as an x-ray absorber material. The thicknesses of diamond 41b as the first x-ray absorber and tungsten 41c as the second x-ray absorber are selected such that the total sum of respective x-ray phase shift amounts is approximately $-\pi$ radian, the total x-ray transmittance of diamond 41b and tungsten 41c is approximately 33%, and the mask contrast is 3.

In case of x-rays having a wavelength of 0.8 nm, for example, when the thickness of diamond 41b as the first x-ray absorber is 640 nm and the thickness of tungsten 41c as the second x-ray absorber is 300 nm, the respective phase shift amount is $(-1/2)\cdot\pi$ radian. Thus the total phase shift of $-\pi$ radian can be realized in the x-ray absorber as a whole. Furthermore, the x-ray transmittance is 87% in diamond 41b and 45% in tungsten 41c, and then a transmittance of about 35% can be obtained in total. The mask contrast is 2.9 for the x-ray absorber on the whole. In other words, light applied on the x-ray absorber has a phase shift by $-\pi$ radian in the x-ray absorber, and 35% of quantity of light can be transmitted. This effect results from the x-ray absorber formed of a combination of diamond with a high transmittance and tungsten with a low transmittance, which characterizes x-ray mask 4A in accordance with the present invention having a phase shift amount of $-\pi$ radian and an x-ray transmittance from 20% to 50%.

As a material of the first x-ray absorber with a high transmittance, silicon, silicon nitride, silicon carbide, boron nitride or the like may alternatively be used other than diamond in order to attain the similar effect, as the transmittance is 80% or more with the thickness allowing for the x-ray phase shift amount of $(-1/2)\cdot\pi$ radian for x-rays having a wavelength of 0.8 nm.

Furthermore, as a material of the second x-ray absorber with a low transmittance, titanium, vanadium, chrome manganese, iron, cobalt, nickel, copper, zinc, gallium, germanium, ruthenium, rhodium, palladium, silver, indium, tin, antimony, tellurium, hafnium, tantalum, rhenium, osmium, iridium, platinum, gold, bismuth, ruthium, lanthanium, cerium, or the like may be used other than tungsten, so that the transmittance is not less than 30% and not more than 60% with a thickness allowing for the x-ray phase shift amount of $(-1/2)\cdot\pi$ radian for x-rays having a wavelength of 0.8 nm. Therefore when a stacked structure formed of the first x-ray absorber and the second x-ray absorber is used as the x-ray absorber, it is possible to set the x-ray transmittance in the range of 20% to 50% and the phase shift amount in the range of $(-1/2)\cdot\pi$ radian to $(-3/2)\cdot\pi$ radian.

In addition, an alloy of these or an alloy of nitride, carbide, oxide and silicon may be used as the x-ray absorber material in the present invention as long as the transmittance is within the range of 30% to 60% with the thickness allowing the x-ray phase shift amount of $(-1/2)\cdot\pi$ radian.

Dry-etching with reactive gas is usually used in the pattern processing of the x-ray absorber. As the x-ray absorber in the present invention has two separate layers of the first x-ray absorber and the second x-ray absorber, reactive gases optimal for the respective layers can be selected and used to attain a good pattern geometry. As a result, a fine absorber pattern can be easily processed.

As long as the x-ray absorber has an x-ray transmittance in the range of 20% to 50% and a phase shift amount in the range of $(-1/2)\cdot\pi$ radian to $(-3/2)\cdot\pi$ radian, a third or fourth film may be deposited either between the x-ray transmission body and the first x-ray absorber or between the first x-ray absorber and the second x-ray absorber. A multi-layer structure may be employed. Particularly, if a hard mask material or an etching stopper material for use in the pattern processing of the x-ray absorber is deposited either between the x-ray transmission body and the first x-ray absorber or between the first x-ray absorber and the second x-ray absorber in advance, the thickness of the absorber and the pattern size can be controlled with high precision.

The similar effect can be achieved when a first x-ray absorber material with a high transmittance and a second x-ray absorber material with a low transmittance as described above are mixed and deposited as a single-layer x-ray absorber. Although the present embodiment has been illustrated as using diamond as a material of the x-ray transmission body, the expected effect with the use of the x-ray mask in the present invention does not depend on the material of the x-ray transmission body. Therefore silicon, silicon carbide, silicon nitride or diamond having a different thickness may be used as a x-ray transmission body material.

Furthermore, as in the present embodiment, where the x-ray transmission body and the first x-ray absorber are made of the same material, the first x-ray absorber may be formed by processing a part of the x-ray transmission body and forming a new pattern.

Figure 3:
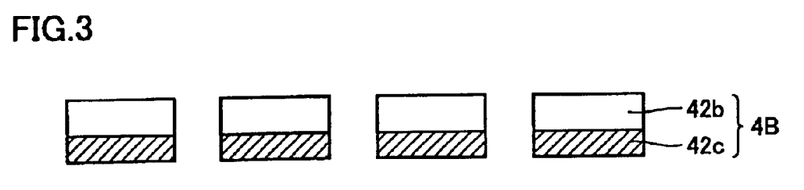
FIG. 3 illustrates a cross-sectional structure of a stencil mask in which an x-ray mask is formed of only an x-ray absorber having a two-layer structure formed of an x-ray absorber with a high transmittance and an x-ray absorber with a low transmittance.

In addition, as shown in FIG. 3, when a stencil mask is used in which x-ray mask 4B is formed only with x-ray absorber 4B having a two-layer structure of an x-ray absorber 42b with a high transmittance and an x-ray absorber 42c with a low transmittance, without the x-ray transmission body, the exposure intensity can be further increased as the attenuation of x-rays in the x-ray transmission body is eliminated.

Although in the present embodiment the configuration of the x-ray absorber material has been described in case of x-rays having a wavelength of 0.8 nm, the transmittance and the phase shift amount are varied with the wavelength of x-rays and the optimal x-ray absorber material, and film thickness is varied with the wavelength. More specifically, in the x-ray mask in accordance with the present invention, an x-ray absorber material having an x-ray phase shift amount of about $-\pi$ radian and a transmittance in the range of 20% to 50% is used.

(Exposure Method)

Returning to FIG. 1, a 160 nm (W) opening mask pattern was transferred which was formed in x-ray mask 4A formed of a 2 μm thick diamond 41a as an x-ray transmission body material and a two-layer structure of diamond 41b having a thickness of 640 nm and a density of 3.5 g/cm³ and tungsten 41c having a thickness of 300 nm and a density of 16.2 g/cm³ as an x-ray absorber material.

The exposure was carried out with an x-ray exposure device in which radiation from a radiation generating device with a deflection magnetic field intensity of 3.5 T and acceleration energy of 0.585 GeV was condensed by a beamline using two platinum mirrors having an oblique-incident angle of 1°, and light passing through a beryllium window of 20 μm in thickness of a vacuum partition and the x-ray mask was used for exposure. The pattern was formed by photosensitizing a resist of 0.2 μm in thickness using polyhydroxystyrene as a base resin. The average absorption wavelength of the resist was about 0.8 nm. Exposures were carried out with varied exposure gaps. As a result, with the exposure gaps in the range of 8 μm to 16 μm, a fine opening pattern reduced to approximately one-half to one-quarter of the mask opening pattern size, that is, from 80 nm to 40 nm, could be formed.

This is because the phase shift using the x-ray absorber is just $-\pi$ radian in case of the wavelength of 0.8 nm, and contribution from the second Fresnel's annular zone to the intensity at the opening center is increased. The high resolution range is wide with respect to the exposure gaps because (i) because of the use of radiation, the absorption spectrum in the resist may have a wide range from 0.6 nm to 1.2 nm and an optimal exposure gap is varied with the respective wavelengths, and (ii) the phase shift amount of x-ray absorber 40b is varied approximately in the range of $(-1/2)\cdot\pi$ radian to $(-3/2)\cdot\pi$ radian with the wavelength in the range of 0.6 nm to 1.2 nm.

In the present embodiment, the exposure intensity can be improved at the center of the opening, the pattern can be formed more rapidly, resulting in an improved throughput. Although radiation from a radiation generating device is used as the x-ray source in the description of the present embodiment, on the principle of the present invention, the x-ray source is not limited to radiation and x-rays generated in a manner different from radiation, such as a plasma x-ray source may be used to attain the similar effect.

(Second Embodiment)

(X-ray Mask 4C)

Figure 4:
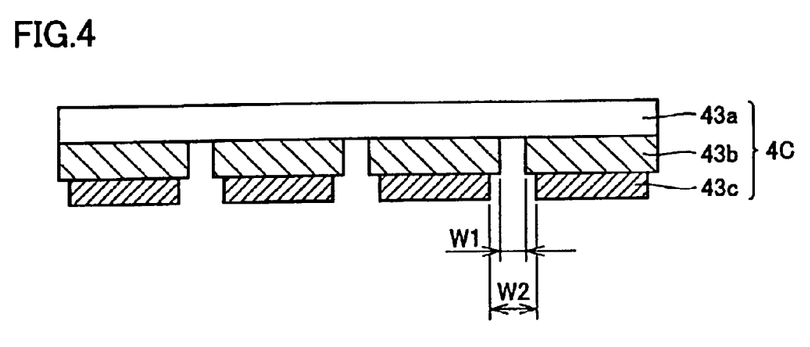
FIG. 4 illustrates a cross-sectional structure of an x-ray mask in accordance with a second embodiment of the present invention.

Referring to FIG. 4, an x-ray mask 4C in accordance with a second embodiment will now be described. FIG. 4 shows a cross-sectional structure of x-ray mask 4C formed of an x-ray transmission body material 43a and an x-ray absorber having a two-layer structure formed of a first x-ray absorber 43b with a high transmittance and a second x-ray absorber 43c with a low transmittance, having an x-ray phase shift of $(-\pi/2)\cdot$radian for each and of $-\pi$ radian in total. First x-ray absorber 43b with a high transmittance is provided on the side closer to x-ray transmission body 43a.

An opening portion of first x-ray absorber 43b with a high transmittance is provided to be included in an opening portion of second x-ray absorber 43c with a low transmittance. An opening size (W1) of first x-ray absorber 43b is smaller in width than an opening size (W2) of second x-ray absorber 43c. The opening size (W2) has the same dimension as the first Fresnel's annular zone. With this configuration, the phase difference on the resist at the opening center between light passing through the opening center and light passing through the opening end of the opening pattern of the second x-ray absorber is $(1/2)\cdot\pi$ radian in total with a phase difference $-\pi$ radian by the optical path difference and a phase shift amount $(-1/2)\cdot\pi$ radian by the first x-ray absorber. In other words, as in the present embodiment, when the opening size of the first x-ray absorber is narrower than the opening size of the second x-ray absorber, the phase difference of the light passing through the end of the opening of the first absorber is reduced from $\pi$ radian to $(1/2)\cdot\pi$ radian and the intensity at the center of the opening is further improved. As a result, a finer pattern can be formed.

(X-ray mask 4D)

Figure 5:
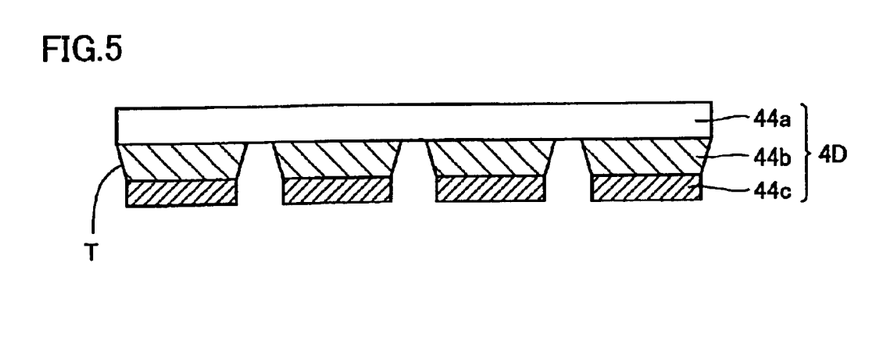
FIG. 5 illustrates a cross-sectional structure of an x-ray mask in another form of the second embodiment of the present invention.

In the present embodiment, first x-ray absorber 43b with a high transmittance has a narrower opening portion with a constant thickness. As an alternative structure, as shown in an x-ray mask 4D in FIG. 5, an opening region of a first x-ray absorber 44b with a high transmittance may have a tapered shape (T), which is gradually increased in size from x-ray transmission body 44a toward a second x-ray absorber 44c with a low transmittance. By employing such a tapered shape (T), the phase shift amount of the x-ray absorber material is increased. Therefore the intensity at the center of the opening portion is increased and a finer pattern can be formed.

(X-ray mask 4E)

Figure 6:
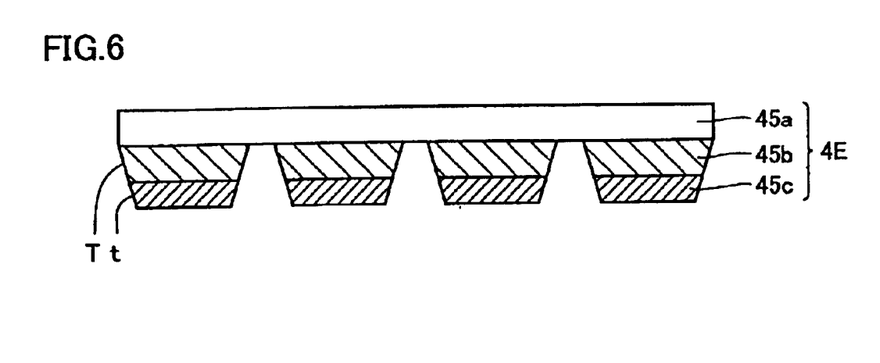
FIG. 6 illustrates a cross-sectional structure of an x-ray mask in yet another form of the second embodiment of the present invention.

It is noted that, in addition to the opening region of first x-ray absorber 44b with a high transmittance as shown in x-ray mask 4D, a continuous tapered shape (T, t) may be employed in which an opening region of a first x-ray absorber 45b with a high transmittance and an opening region of a second x-ray absorber 45c with a low transmittance are gradually increased in size as they are away from an x-ray transmission body 45a, as shown in an x-ray mask 4E in FIG. 6.

(Third Embodiment)

(X-ray Mask 4F)

Figure 7:
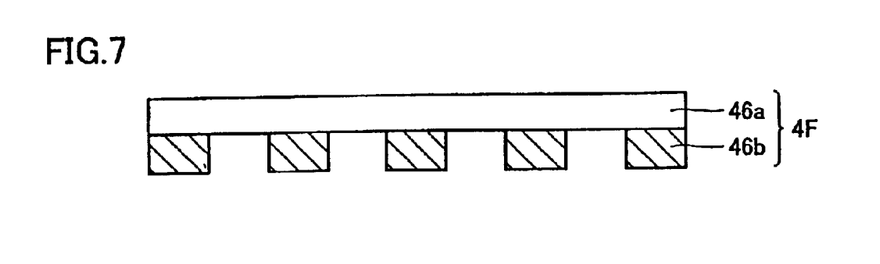
FIG. 7 illustrates a cross-sectional structure of an x-ray mask in accordance with a third embodiment of the present invention.

Referring to FIG. 7, an x-ray mask 4F in accordance with a third embodiment will now be described. FIG. 7 illustrates a cross-sectional shape of a periodic line-and-space mask pattern formed of an x-ray transmission body 46a and an x-ray absorber 46b having a transmittance of at least 70% and an x-ray phase shift amount of –π radian. When a single, diamond layer of 1.27 μm in thickness is used as a material of an x-ray absorber 46b, an x-ray phase shift amount of –π radian and a transmittance of 75% can be obtained for x-rays having a wavelength of 0.8 nm.

When this x-ray mask 4F was transferred using an exposure spectrum of average absorption wavelength 0.8 nm with an exposure gap of 10 μm, a half-period, 45 nm line-and-space transfer pattern could be formed with a line-and-space mask pattern having a mask pattern size of 90 nm that satisfies $(G \cdot \lambda)^{1/2}$.

Figure 8:
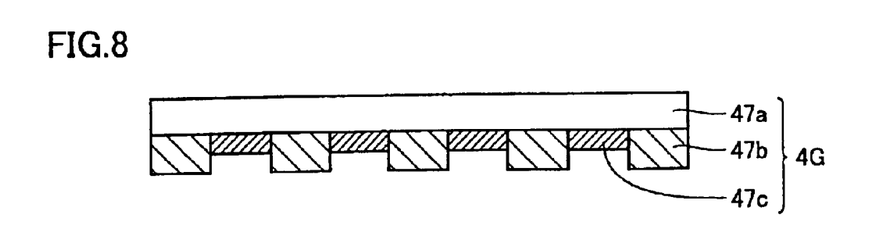
FIG. 8 illustrates a cross-sectional structure of an x-ray mask in another form of the third embodiment of the present invention.

In an x-ray mask 4G shown in FIG. 8, in comparison with the structure of x-ray mask 4F shown in FIG. 7, a transmittance adjusting film 47c having the same transmittance as an x-ray absorber 47b and the phase shift amount of not more than half that of x-ray absorber 47b is deposited on an x-ray transmission body 47a exposed between x-ray absorbers 47b.

By providing transmittance adjusting film 47c in this manner, x-ray absorber 47b and x-ray transmission body 47a have the same transmittance. Therefore the pattern could be formed in a more uniform manner. When titanium, vanadium, chrome, manganese, iron, cobalt, nickel, copper, zinc, gallium, germanium, ruthenium, rhodium, palladium, silver, indium, tin, antimony, tellurium, hafnium, tungsten, tantalum, rhenium, osmium, iridium, platinum, gold, bismuth, ruthium, lanthanium, cerium is employed as transmittance adjusting film 47c, the phase shift amount with a thickness allowing for a transmittance of 75% for x-rays having a wavelength of 0.8 nm is not less than half that of 1.27 μm thick diamond.

Furthermore, when nickel, copper, zinc, gallium, germanium and tungsten, tantalum, rhenium, osmium, iridium, platinum, gold is employed as transmittance adjusting film 47c, more effectively, the phase shift amount is not less than one-third of that of 1.27 μm thick diamond.

(Fourth Embodiment)

A semiconductor device was manufactured using the exposure method illustrated in the first embodiment above. A 160 nm opening mask pattern was transferred which was formed in an x-ray mask formed of 2 μm thick diamond as an x-ray transmission body material and a two-layer as an x-ray absorber material of diamond having a thickness of 640 nm and a density of 3.5 g/cm³ (a first x-ray absorber) and tungsten having a thickness of 300 nm and a density of 16.2 g/cm³ (a second x-ray absorber).

For the exposure, radiation from a radiation generating device with a deflection magnetic field intensity of 3.5 T and acceleration energy of 0.585 GeV was condensed by a beamline using two platinum mirrors having an oblique-incident angle of 1°, and light passing through a beryllium window of 20 μm in thickness of a vacuum partition and an x-ray mask was used. Using a 160 nm isolated opening x-ray mask pattern, a resist of 0.2 μm in thickness using polyhydroxystyrene as a base resin with an exposure gap of 12 μm was photosensitized to form a 40 nm opening pattern which was one-fourth of the mask pattern size. This resist pattern was etched to process an underlying film, followed by washing and deposition, and then an exposure was performed again using another x-ray mask. These steps were repeated in order to manufacture a semiconductor device.

As a result, as compared with using the conventional x-ray mask, a finer pattern could be formed and transferred by using the x-ray mask having an x-ray phase shift amount of π radian, which is the feature of the present invention. Therefore a semiconductor device with higher performance could be manufactured.

In accordance with the x-ray mask of the present invention, a pattern finer than a mask pattern can be formed using an isolated opening mask pattern.

Furthermore, in accordance with the exposure method of the present invention, the exposure time can be shortened and the throughput is improved by using the x-ray mask allowing the intensity at the center of the isolated opening to be increased.

In addition, in accordance with the semiconductor device manufactured through the exposure method of the present invention, a finer pattern could be formed as compared with using the conventional x-ray mask and a semiconductor device with higher performance can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An x-ray mask comprising:
    a x-ray transmission body;
    a first x-ray absorber having a first opening and disposed on said x-ray transmission body, wherein said first x-ray absorber and said x-ray transmission body are the same material; and
    a second x-ray absorber, disposed on said first x-ray absorber and having a second opening aligned with the first opening and having a width larger than the first opening in said first x-ray absorber.

2. The x-ray mask according to claim 1 wherein said x-ray transmission body and said first x-ray transmission body are a material selected from the group consisting of diamond, silicon, silicon carbide, and silicon nitride.

3. The x-ray mask according to claim 1 wherein said second x-ray absorber is a material selected from the group consisting of tungsten, titanium, vanadium, chrome, manganese, iron, cobalt, nickel, copper, zinc, gallium, germanium, ruthenium, osmium, iridium, platinum, gold, bismuth, and cerium.

4. An x-ray mask including an x-ray transmission body and an x-ray absorber, wherein said x-ray transmission body and said x-ray absorber are the same material.

5. The x-ray mask according to claim 4 wherein said x-ray transmission body and said x-ray transmission body are a material selected from the group consisting of diamond, silicon, silicon carbide, and silicon nitride.

6. The x-ray mask according to claim 4, wherein said x-ray absorber has an opening and including a transmittance adjusting film on said x-ray transmission body in the opening in said x-ray absorber.

7. The x-ray mask according to claim 6 wherein said x-ray transmittance adjusting film is a material selected from the group consisting of tungsten titanium, vanadium, chrome, manganese, iron, cobalt, nickel, copper, zinc, gallium, germanium, ruthenium, rhodium, palladium, silver, indium, tin, antimony, tellurium, hafnium, tantalum, rhenium, osmium, iridium, platinum, gold, bismuth, and cerium.

* * * * *